US012635064B2

(12) United States Patent
Mariscal

(10) Patent No.: US 12,635,064 B2
(45) Date of Patent: May 19, 2026

(54) HIGH DENSITY SKIP LAYER TRANSMISSION LINE WITH PLATED SLOT

(71) Applicant: Intel Corporation, Santa Clara, CA (US)

(72) Inventor: Carlos Mariscal, Gresham, OR (US)

(73) Assignee: Intel Corporation, Santa Clara, CA (US)

( * ) Notice: Subject to any disclaimer, the term of this patent is extended or adjusted under 35 U.S.C. 154(b) by 243 days.

(21) Appl. No.: 17/705,270

(22) Filed: Mar. 25, 2022

(65) Prior Publication Data

US 2022/0217835 A1 Jul. 7, 2022

(51) Int. Cl.
*H05K 1/00* (2006.01)
*H05K 1/02* (2006.01)

(52) U.S. Cl.
CPC ......... *H05K 1/0228* (2013.01); *H05K 1/0224* (2013.01)

(58) Field of Classification Search
CPC ........................... H05K 1/0228; H05K 1/0224
See application file for complete search history.

(56) References Cited

U.S. PATENT DOCUMENTS

| | | | | |
|---|---|---|---|---|
| 6,809,608 | B2 | 10/2004 | Fjelstad | |
| 6,870,438 | B1 | 3/2005 | Shino et al. | |
| 7,705,695 | B2 * | 4/2010 | Kushta .................. | H01P 1/2039 |
| | | | | 333/204 |
| 7,999,361 | B1 * | 8/2011 | Chen ..................... | H01L 23/552 |
| | | | | 257/659 |
| 2002/0050870 | A1 | 5/2002 | Koga | |
| 2006/0022769 | A1 | 2/2006 | Takasu | |
| 2009/0184778 | A1 | 7/2009 | Park et al. | |
| 2010/0259338 | A1 | 10/2010 | Jow et al. | |
| 2011/0121922 | A1 | 5/2011 | Blair et al. | |
| 2011/0279190 | A1 * | 11/2011 | Liu ......................... | H01P 5/085 |
| | | | | 333/32 |
| 2014/0034363 | A1 | 2/2014 | Biddle | |

(Continued)

FOREIGN PATENT DOCUMENTS

| JP | H06334449 A | 12/1994 |
|---|---|---|
| JP | H0998005 A | 4/1997 |

OTHER PUBLICATIONS

"Intel Tofino P4-programmable Ethernet switch ASIC that delivers better performances at lower point," Intel Tofino Series Programmable Ethernet Switch ASIC, Network Communications and I/O Products by Intel, retrieved on Mar. 21, 2022, 3 pages.

(Continued)

*Primary Examiner* — Pete T Lee
(74) *Attorney, Agent, or Firm* — NICHOLSON DE VOS WEBSTER & ELLIOTT LLP

(57) ABSTRACT

Methods and apparatus relating to a high density skip layer transmission line with a plated slot are described. In one embodiment, a printed circuit board includes a plurality of transmission lines. A first transmission from the plurality of transmission lines includes a first signal trace and a first ground plane and a first plated slot coupled to a second plated slot via the first ground plane. A ground shield is formed by the first plated slot, the second plated slot, the first ground plane, and a second ground plane. The ground shield surrounds the first signal trace to reduce crosstalk between signal traces. Other embodiments are also claimed and disclosed.

20 Claims, 7 Drawing Sheets

GND Plane 204A
GND Plated Slot 202A
GND Shield 206
GND Plated Slot 202B
Signal Traces 104
GND Plane 204B
200

(56)          References Cited

U.S. PATENT DOCUMENTS

| | | |
|---|---|---|
| 2014/0034376 A1 | 2/2014 | Biddle |
| 2014/0127930 A1 | 5/2014 | Schmelz et al. |
| 2018/0180828 A1* | 6/2018 | Zhao ..................... H05K 1/181 |
| 2020/0227362 A1* | 7/2020 | Thibado ................. H01B 3/305 |

OTHER PUBLICATIONS

Cuttress, Ian, "Intel's New 224G PAM4 Transceivers," AnandTech, Aug. 21, 2020, 4 pages.

* cited by examiner

Figure 1:
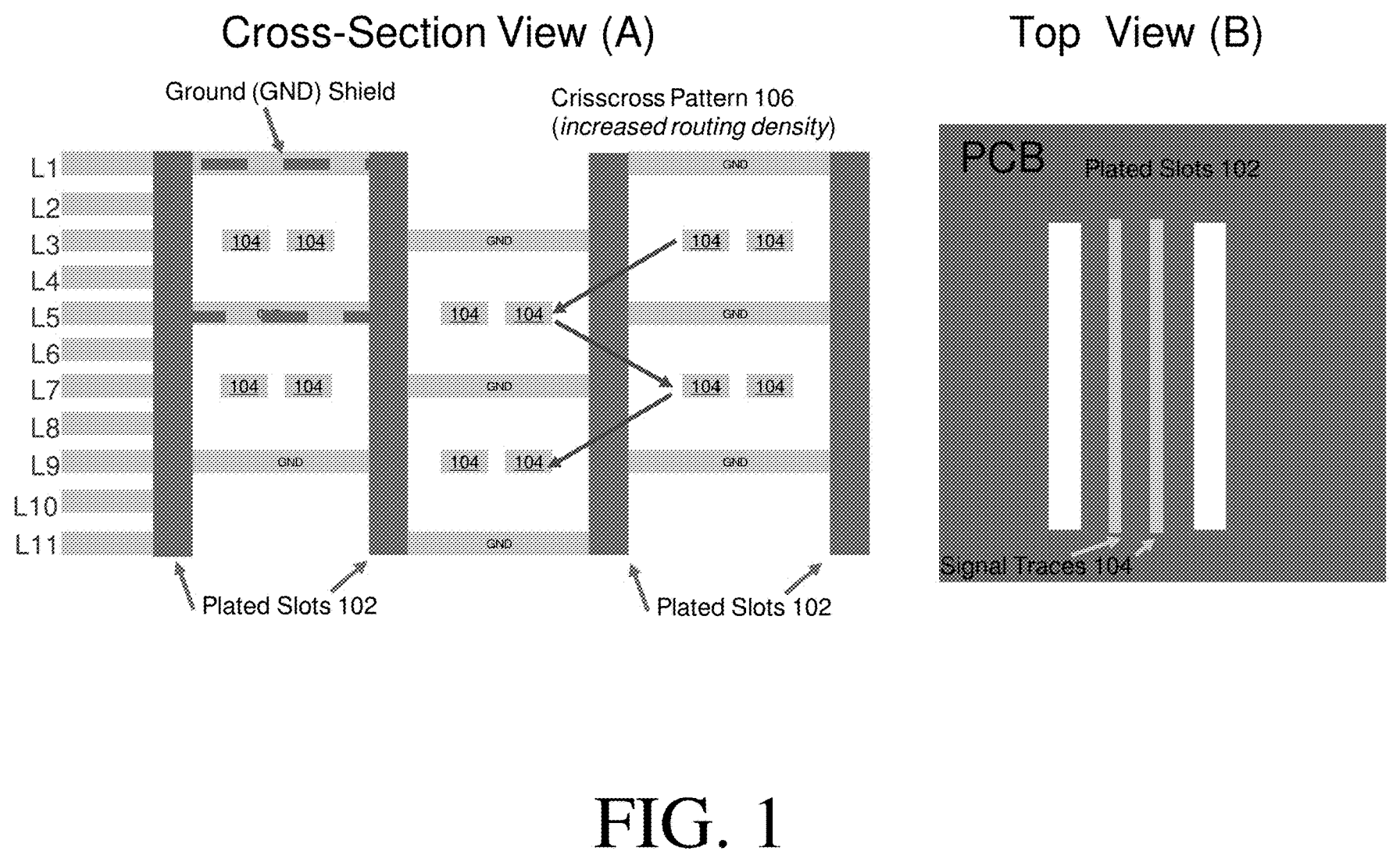

Top View (B)

PCB     Plated Slots 102

Signal Traces 104

Cross-Section View (A)

Crisscross Pattern 106
(increased routing density)

Ground (GND) Shield

GND     104     104

GND     104     104

GND     104

GND     104     104

GND     104     104

GND     104

104

104

104

104

Plated Slots 102

Plated Slots 102

Plated Slots 102

HIGH DENSITY SKIP LAYER TRANSMISSION LINE WITH PLATED SLOT

FIELD

The present disclosure generally relates to the field of electronics. More particularly, an embodiment relates to a high density skip layer transmission line with a plated slot.

BACKGROUND

Printed Circuit Board (PCB) loss targets are increasingly becoming unsurmountable. For example, with advanced PCB material (such as smooth copper and ultra-loss dielectrics), even under ideal conditions, the loss targets may still not be achievable. Moreover, some current solutions are marginally meeting loss targets for applications above a Nyquist frequency of 28 Giga Hertz (GHz).

Accordingly, improved solutions to meet the increasing PCB loss targets are needed.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

FIG. 1 illustrates a cross-sectional and a top view of skip layer transmission lines with plated slots, according to some embodiments.

DETAILED DESCRIPTION

Figure 2:
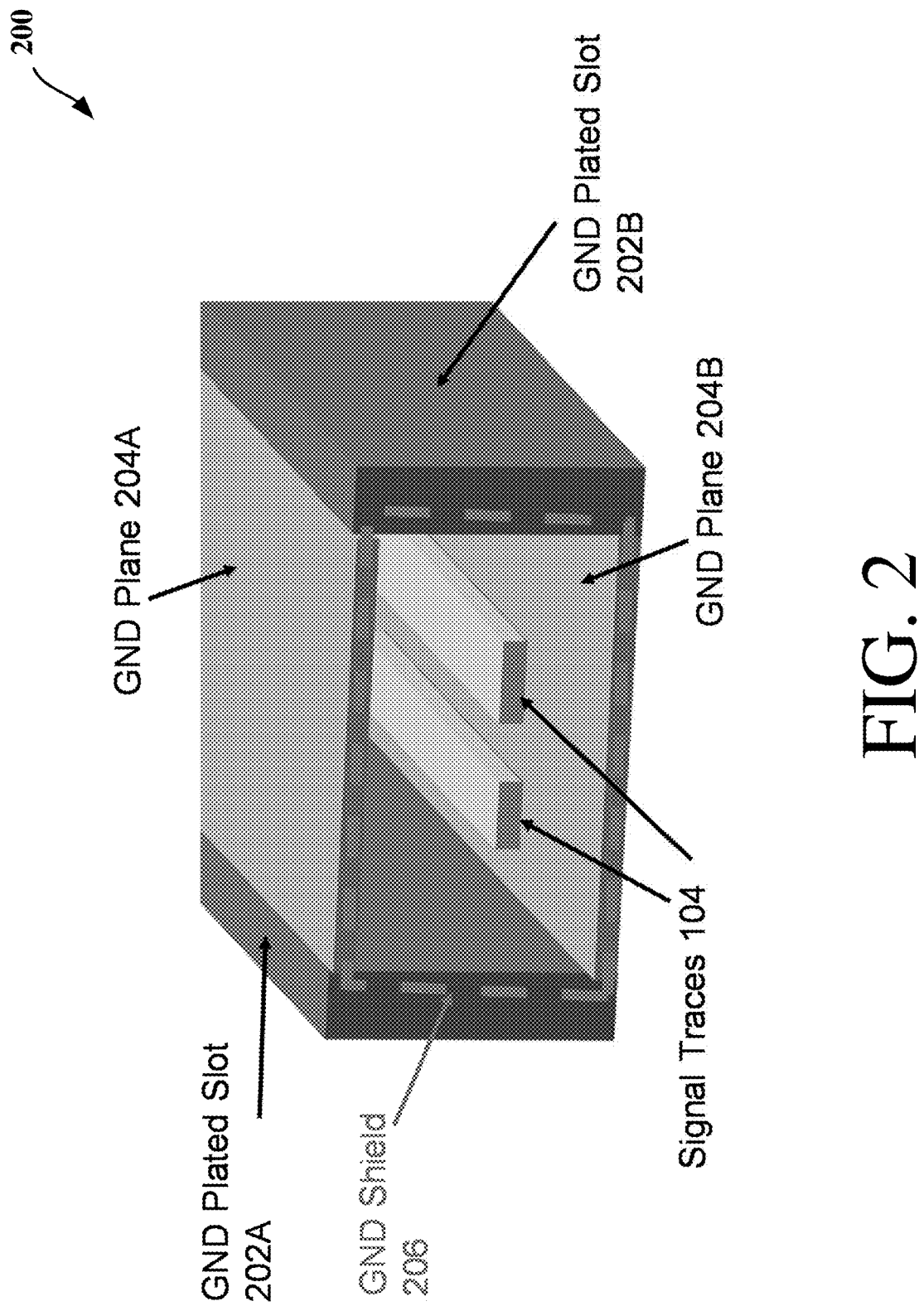
FIG. 2 illustrates a three-dimensional (3D) perspective view of a single structure, according to an embodiment.

In the following description, numerous specific details are set forth in order to provide a thorough understanding of various embodiments. However, various embodiments may be practiced without the specific details. In other instances, well-known methods, procedures, components, and circuits have not been described in detail so as not to obscure the particular embodiments. Further, various aspects of embodiments may be performed using various means, such as integrated semiconductor circuits ("hardware"), computer-readable instructions organized into one or more programs ("software"), or some combination of hardware and software. For the purposes of this disclosure reference to "logic" shall mean either hardware (such as logic circuitry or more generally circuitry or circuit), software, firmware, or some combination thereof.

As mentioned above, Printed Circuit Board (PCB) loss targets are increasingly becoming unsurmountable with higher operating frequencies. For example, some current solutions are marginally meeting loss targets for applications above a high frequency.

While skip layer routing may provide an increase in the dielectric thickness to increase trace width and, as a result, reduce loss, placement of adjacent traces needs to be kept close to maintain higher routing density, in turn, causing high levels of crosstalk across layers. Also, while stitching of vias may be used to mitigate crosstalk, there is a minimum spacing allowed and such tight placement may cause issues with PCB manufacturing.

Some embodiments relate to a high density skip layer transmission line with a plated slot. In one embodiment, a skip layer topology (such as discussed with reference to FIG. 1) is used to reduce signal loss by increasing trace widths. Such techniques mitigate crosstalk and maintain high routing density by using plated slots and/or a crisscross pattern. In an embodiment, after generating a slot through physical routing, the slot is electroplated to allow the inside walls of the slot to be metalized with a thin layer of metal (e.g., using copper).

FIG. 1 illustrates a cross-sectional (A) and a top view (B) of skip layer transmission lines with plated slots, according to some embodiments. As shown, one or more trace layers (labeled as L1 to L11) are skipped and plated slots 102 create ground (GND) walls around high speed signals 104 (labeled as signal trace(s) 104 in FIG. 1).

Generally, a PCB transmission line is a copper interconnection to transmit electrical signals between a sender and a receiver that are coupled to the PCB. A PCB transmission line includes two conductors, a signal trace and a ground plane. The space between the two conductors is filled with a dielectric material.

In order to reduce loss on a PCB signal trace, the signal trace width is increased in an embodiment. As mentioned above, some skip layer topologies may limit routing density due to crosstalk from adjacent layers. By adopting a "crisscross" routing pattern 106 and plated slots 102, this limitation can be eliminated (or at least reduced) as shown in FIG. 1. The plated slot 102 creates a "GND wall" or shield, eliminating (or at least reducing) crosstalk from nearby signals. The crisscross routing 106 can also be used to generate high-density route paths. As shown in FIG. 1, the crisscross pattern 106 places the signal traces 104 amongst alternately skipped layers of the PCB, where adjacent sets of signal traces alternate between the layers of the PCB. In an embodiment, the crisscross pattern results in adjacent signal traces being offset in depth within the PCB/motherboard.

FIG. 2 illustrates a three-dimensional (3D) perspective view of a single structure 200, according to an embodiment. As shown, the plated slots 202A/202B and GND planes 204A/204B form a ground wall (GND shield 206) around the signal traces 104.

Figure 3:
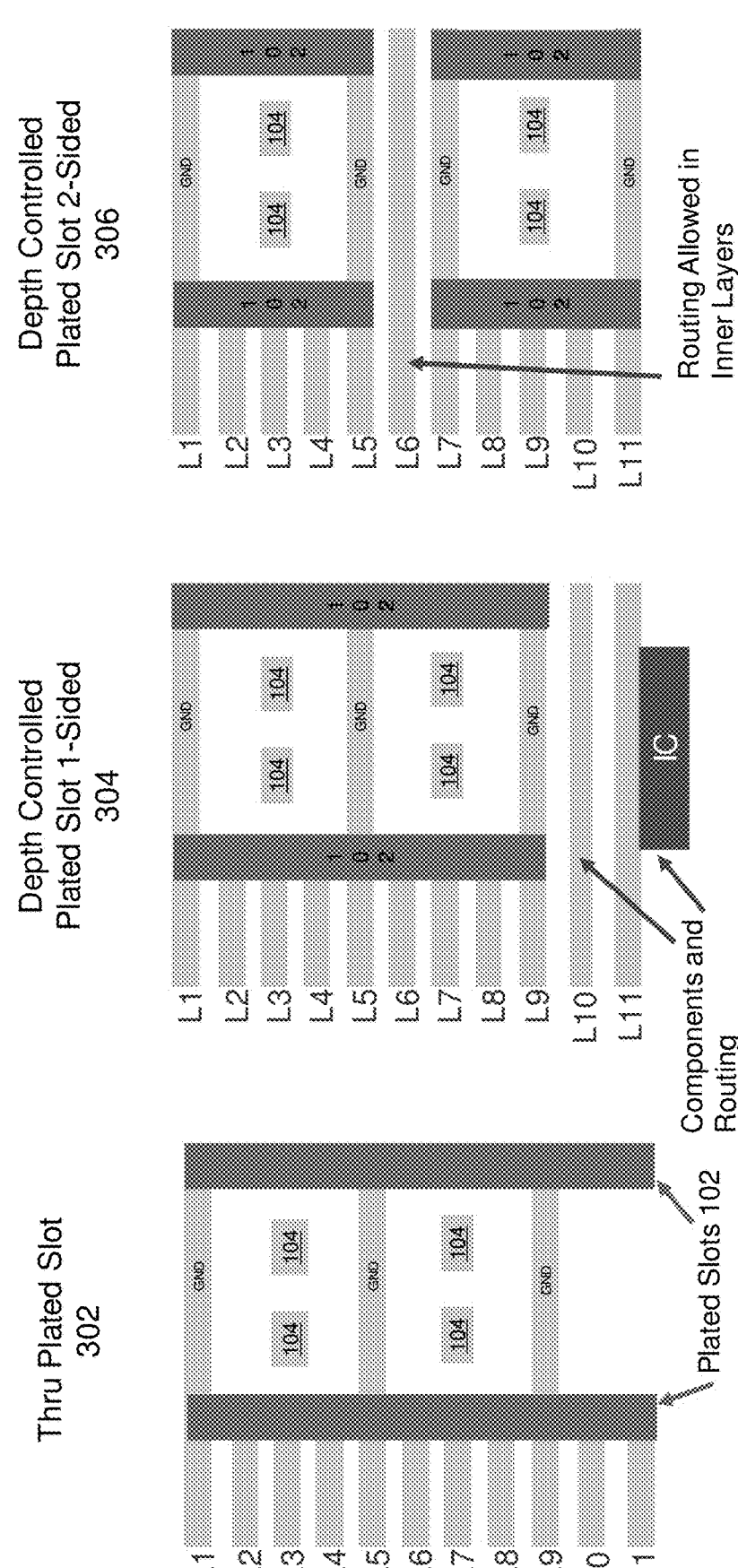
FIG. 3 illustrates three different types of plated slots, according to some embodiments.

FIG. 3 illustrates three different types of plated slots, according to some embodiments. In an embodiment, the plated slots can be mechanically routed and/or plated. Using control depth routing the topology may be improved. With control depth routing, plated slots 102 can be created to specified depths on the PCB, as shown in FIG. 3. This approach would allow part placement under plated slots and/or other signal routing in the inner layers of the PCB in some embodiments.

As seen in FIG. 3, there are three plated slot options in some embodiments:

(1) Thru plated slot 302 where the slot will cover the entire span of the PCB. This can be the most cost effective, but part and routing may not be allowed under the slots 102.

(2) Depth controlled one-sided plated slot 304 where using depth controlled routing, slots may be routed to a desired layer, e.g., leaving the bottom or top of the PCB intact. This would allow for part/component (e.g., Integrated Circuit (IC) device(s)) placement and/or routing under/over the plated slot, respectively.

(3) Depth controlled two-sided plated slot 306 which may be similar to option two above, but this would increase high speed Input/Output (IO) density. This type of depth routing would allow for General Purpose IO (GPIO) and/or power routing in the core of the PCB.

Figure 4:
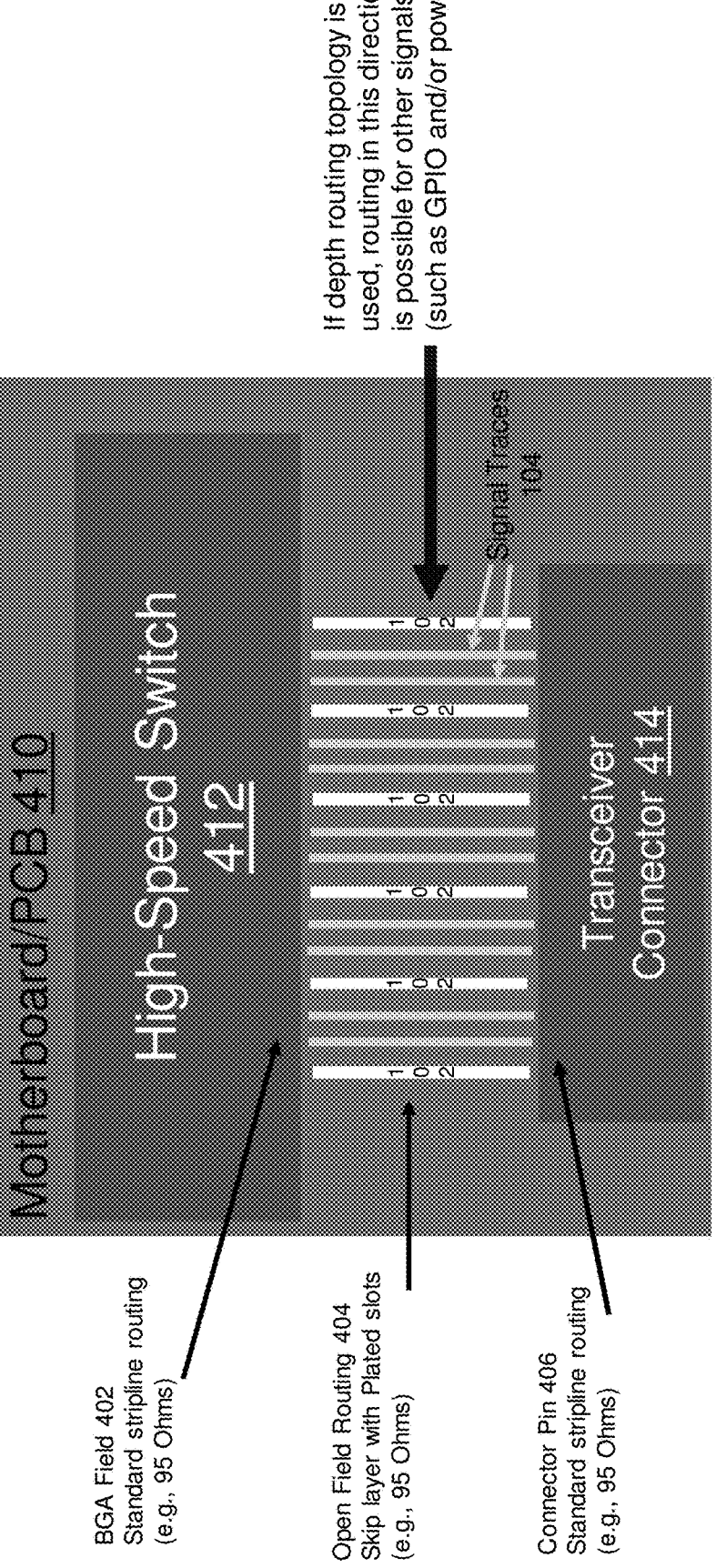
FIG. 4 illustrates a sample use case according to an embodiment.

FIG. 4 illustrates a sample use case according to an embodiment. The topology shown could be used to route a high-speed Serializer/Deserializer (SERDES) logic from a semiconductor package to the connectors. Impedance matching may be maintained (e.g., at 95 Ohms) from the Ball Grid Array (BGA) pin field 402, open field routing 404, and connector pin field 406. The motherboard/PCB 410 includes a high-speed switch 412 (e.g., a 100 G or 100 Giga bit Ethernet (GbE) switch, a 224 G or 224 GbE Ethernet switch, a Peripheral Component Interconnect express (PCIe) switch, etc.), such as provided in Tofino™ series of P4-programmable Ethernet switch Application Specific ICs (ASICs) provided by Intel® Corporation of Santa Clara, California. If a depth control routing topology is used, routing in the direction shown is possible for other signals (such as GPIO and/or power signals) between the switch ASIC and a transceiver connector 414 such as an Octal Small Form factor Pluggable (OSFP) connector, a Quad Small Form factor Pluggable (QSFP) connector, a QSFP Double Density (QSFPDD) connector, etc. Hence, the high-speed switch 412 may be used in various environments such as computing server farms, Ethernet over optical interfaces, etc. to reduce or eliminate crosstalk.

Figure 5:
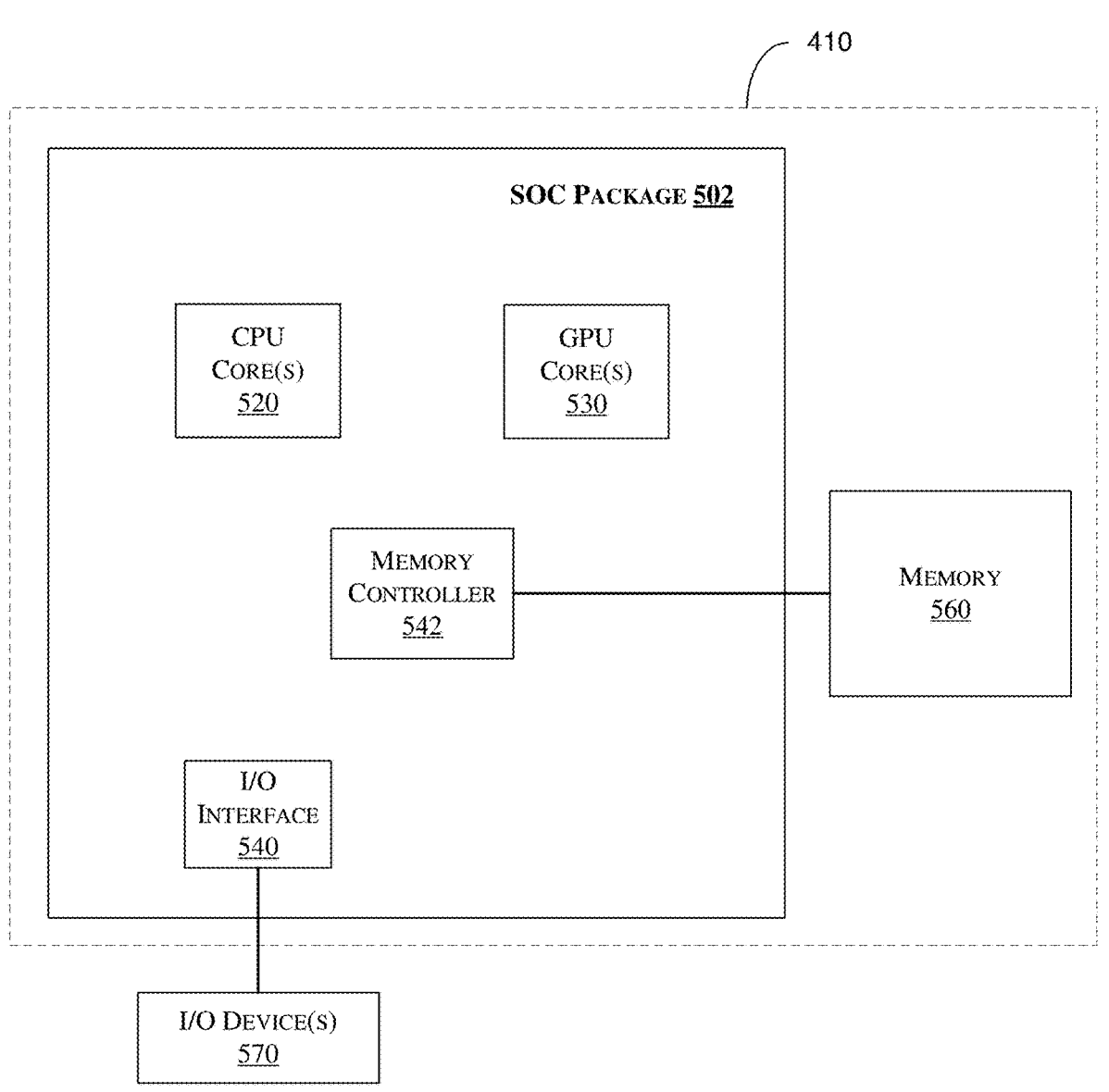
FIG. 5 illustrates a block diagram of an embodiment of a computing system, which may be utilized in various embodiments discussed herein.

FIG. 5 illustrates a block diagram of an SOC package in accordance with an embodiment. As illustrated in FIG. 5, SOC 502 includes one or more Central Processing Unit (CPU) cores 520, one or more Graphics Processor Unit (GPU) cores 530, an Input/Output (I/O) interface 540, and a memory controller 542. Various components of the SOC package 502 may be coupled to an interconnect or bus such as discussed herein with reference to the other figures. Also, the SOC package 502 may include more or less components, such as those discussed herein with reference to the other figures. Further, each component of the SOC package 520 may include one or more other components, e.g., as discussed with reference to the other figures herein. In one embodiment, SOC package 502 (and its components) is provided on one or more Integrated Circuit (IC) die, e.g., which are packaged into a single semiconductor device.

As illustrated in FIG. 5, SOC package 502 is coupled to a memory 560 via the memory controller 542. In an embodiment, the memory 560 (or a portion of it) can be integrated on the SOC package 502.

The I/O interface 540 may be coupled to one or more I/O devices 570, e.g., via an interconnect and/or bus such as discussed herein with reference to other figures. I/O device(s) 570 may include one or more of a keyboard, a mouse, a touchpad, a display, an image/video capture device (such as a camera or camcorder/video recorder), a touch screen, a speaker, or the like.

Figure 6:
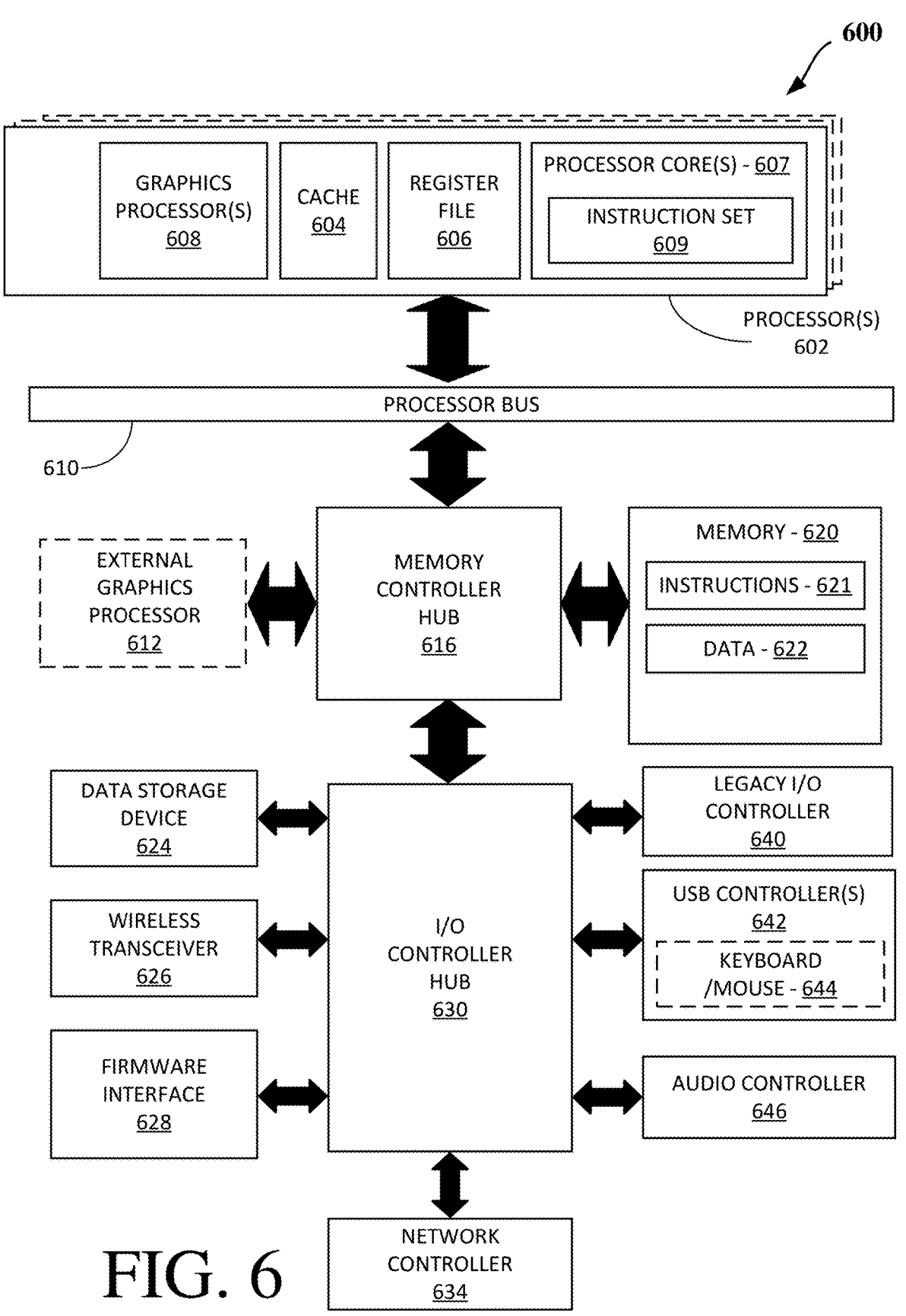
FIG. 6 illustrates a block diagram of an embodiment of a computing system, which may be utilized in various embodiments discussed herein.

FIG. 6 is a block diagram of a processing system 600, according to an embodiment. In various embodiments the system 600 includes one or more processors 602 and one or more graphics processors 608, and may be a single processor desktop system, a multiprocessor workstation system, or a server system having a large number of processors 602 or processor cores 607. In on embodiment, the system 600 is a processing platform incorporated within a system-on-a-chip (SoC or SOC) integrated circuit for use in mobile, handheld, or embedded devices.

An embodiment of system 600 can include, or be incorporated within a server-based gaming platform, a game console, including a game and media console, a mobile gaming console, a handheld game console, or an online game console. In some embodiments system 600 is a mobile phone, smart phone, tablet computing device or mobile Internet device. Data processing system 600 can also include, couple with, or be integrated within a wearable device, such as a smart watch wearable device, smart eyewear device, augmented reality device, or virtual reality device. In some embodiments, data processing system 600 is a television or set top box device having one or more processors 602 and a graphical interface generated by one or more graphics processors 608.

In some embodiments, the one or more processors 602 each include one or more processor cores 607 to process instructions which, when executed, perform operations for system and user software. In some embodiments, each of the one or more processor cores 607 is configured to process a specific instruction set 609. In some embodiments, instruction set 609 may facilitate Complex Instruction Set Computing (CISC), Reduced Instruction Set Computing (RISC), or computing via a Very Long Instruction Word (VLIW). Multiple processor cores 607 may each process a different instruction set 609, which may include instructions to facilitate the emulation of other instruction sets. Processor core 607 may also include other processing devices, such a Digital Signal Processor (DSP).

In some embodiments, the processor 602 includes cache memory 604. Depending on the architecture, the processor 602 can have a single internal cache or multiple levels of internal cache. In some embodiments, the cache memory is shared among various components of the processor 602. In some embodiments, the processor 602 also uses an external cache (e.g., a Level-3 (L3) cache or Last Level Cache (LLC)) (not shown), which may be shared among processor cores 607 using known cache coherency techniques. A register file 606 is additionally included in processor 602 which may include different types of registers for storing different types of data (e.g., integer registers, floating point registers, status registers, and an instruction pointer register). Some registers may be general-purpose registers, while other registers may be specific to the design of the processor 602.

In some embodiments, processor 602 is coupled to a processor bus 610 to transmit communication signals such as address, data, or control signals between processor 602 and other components in system 600. In one embodiment the system 600 uses an exemplary 'hub' system architecture, including a memory controller hub 616 and an Input Output (I/O) controller hub 630. A memory controller hub 616 facilitates communication between a memory device and other components of system 600, while an I/O Controller Hub (ICH) 630 provides connections to I/O devices via a local I/O bus. In one embodiment, the logic of the memory controller hub 616 is integrated within the processor.

Memory device 620 can be a dynamic random access memory (DRAM) device, a static random access memory (SRAM) device, flash memory device, phase-change memory device, or some other memory device having suitable performance to serve as process memory. In one embodiment the memory device 620 can operate as system memory for the system 600, to store data 622 and instructions 621 for use when the one or more processors 602 executes an application or process. Memory controller hub 616 also couples with an optional external graphics processor 612, which may communicate with the one or more graphics processors 608 in processors 602 to perform graphics and media operations.

In some embodiments, ICH 630 enables peripherals to connect to memory device 620 and processor 602 via a high-speed I/O bus. The I/O peripherals include, but are not limited to, an audio controller 646, a firmware interface 628, a wireless transceiver 626 (e.g., Wi-Fi, Bluetooth), a data storage device 624 (e.g., hard disk drive, flash memory, etc.), and a legacy I/O controller 640 for coupling legacy (e.g., Personal System 2 (PS/2)) devices to the system. One or more Universal Serial Bus (USB) controllers 642 connect input devices, such as keyboard and mouse 644 combinations. A network controller 634 may also couple to ICH 630. In some embodiments, a high-performance network controller (not shown) couples to processor bus 610. It will be appreciated that the system 600 shown is exemplary and not limiting, as other types of data processing systems that are differently configured may also be used. For example, the I/O controller hub 630 may be integrated within the one or more processor 602, or the memory controller hub 616 and I/O controller hub 630 may be integrated into a discreet external graphics processor, such as the external graphics processor 612.

Figure 7:
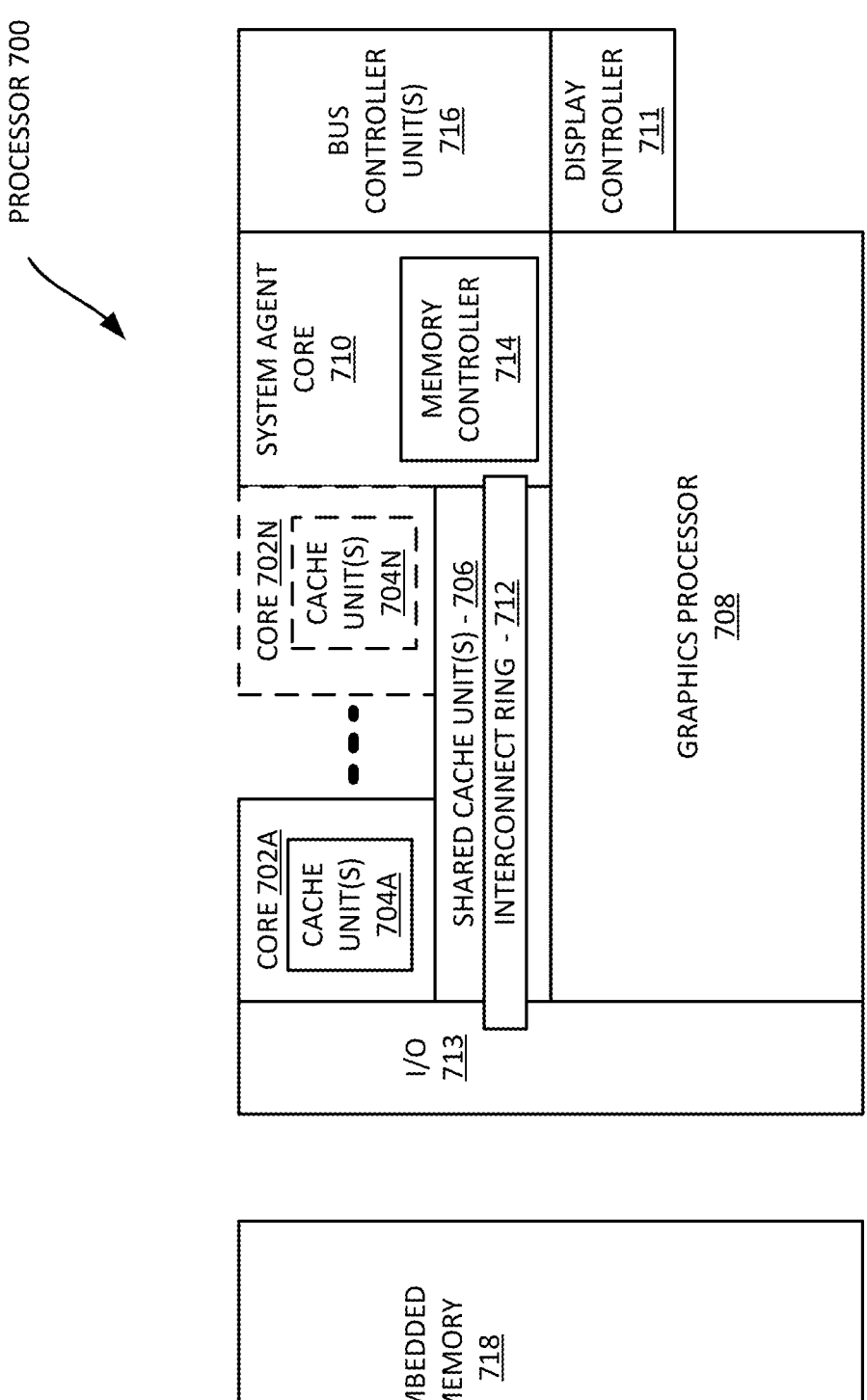
FIG. 7 illustrates various components of a processer in accordance with some embodiments.

FIG. 7 is a block diagram of an embodiment of a processor 700 having one or more processor cores 702A to 702N, an integrated memory controller 714, and an integrated graphics processor 708. Those elements of FIG. 7 having the same reference numbers (or names) as the elements of any other figure herein can operate or function in any manner similar to that described elsewhere herein, but are not limited to such. Processor 700 can include additional cores up to and including additional core 702N represented by the dashed lined boxes. Each of processor cores 702A to 702N includes one or more internal cache units 704A to 704N. In some embodiments each processor core also has access to one or more shared cached units 706.

The internal cache units 704A to 704N and shared cache units 706 represent a cache memory hierarchy within the processor 700. The cache memory hierarchy may include at least one level of instruction and data cache within each processor core and one or more levels of shared mid-level cache, such as a Level 2 (L2), Level 3 (L3), Level 4 (L4), or other levels of cache, where the highest level of cache before external memory is classified as the LLC. In some embodiments, cache coherency logic maintains coherency between the various cache units 706 and 704A to 704N.

In some embodiments, processor 700 may also include a set of one or more bus controller units 716 and a system agent core 710. The one or more bus controller units 716 manage a set of peripheral buses, such as one or more Peripheral Component Interconnect buses (e.g., PCI, PCI Express). System agent core 710 provides management functionality for the various processor components. In some embodiments, system agent core 710 includes one or more integrated memory controllers 714 to manage access to various external memory devices (not shown).

In some embodiments, one or more of the processor cores 702A to 702N include support for simultaneous multi-threading. In such embodiment, the system agent core 710 includes components for coordinating and operating cores 702A to 702N during multi-threaded processing. System agent core 710 may additionally include a power control unit (PCU), which includes logic and components to regulate the power state of processor cores 702A to 702N and graphics processor 708.

In some embodiments, processor 700 additionally includes graphics processor 708 to execute graphics processing operations. In some embodiments, the graphics processor 708 couples with the set of shared cache units 706, and the system agent core 710, including the one or more integrated memory controllers 714. In some embodiments, a display controller 711 is coupled with the graphics processor 708 to drive graphics processor output to one or more coupled displays. In some embodiments, display controller 711 may be a separate module coupled with the graphics processor via at least one interconnect, or may be integrated within the graphics processor 708 or system agent core 710.

In some embodiments, a ring-based interconnect unit 712 is used to couple the internal components of the processor 700. However, an alternative interconnect unit may be used, such as a point-to-point interconnect, a switched interconnect, or other techniques, including techniques well known in the art. In some embodiments, graphics processor 708 couples with the ring interconnect 712 via an I/O link 713.

The exemplary I/O link 713 represents at least one of multiple varieties of I/O interconnects, including an on package I/O interconnect which facilitates communication between various processor components and a high-performance embedded memory module 718, such as an eDRAM (or embedded DRAM) module. In some embodiments, each of the processor cores 702 to 702N and graphics processor 708 use embedded memory modules 718 as a shared Last Level Cache.

In some embodiments, processor cores 702A to 702N are homogenous cores executing the same instruction set architecture. In another embodiment, processor cores 702A to 702N are heterogeneous in terms of instruction set architecture (ISA), where one or more of processor cores 702A to 702N execute a first instruction set, while at least one of the other cores executes a subset of the first instruction set or a different instruction set. In one embodiment processor cores 702A to 702N are heterogeneous in terms of microarchitecture, where one or more cores having a relatively higher power consumption couple with one or more power cores having a lower power consumption. Additionally, processor 700 can be implemented on one or more chips or as an SoC integrated circuit having the illustrated components, in addition to other components.

The following examples pertain to further embodiments. Example 1 includes a printed circuit board comprising: a plurality of transmission lines, wherein a first transmission from the plurality of transmission lines includes a first signal trace and a first ground plane; and a first plated slot coupled to a second plated slot via the first ground plane, wherein a ground shield is to be formed by the first plated slot, the second plated slot, the first ground plane, and a second ground plane, wherein the ground shield is to surround the first signal trace to reduce crosstalk between signal traces. Example 2 includes the printed circuit board of example 1, wherein a plurality of signal traces is to be arranged in a crisscross pattern amongst alternatively skipped layers of the printed circuit board to reduce crosstalk between the plurality of signal traces. Example 3 includes the printed circuit board of example 1, wherein a width of the first signal trace is to be increased to reduce signal loss. Example 4 includes the printed circuit board of example 1, wherein the printed circuit board comprises a plurality of trace layers. Example 5 includes the printed circuit board of example 1, wherein the printed circuit board comprises a plurality of trace layers, wherein the plurality of transmission lines is to be formed on a subset of the plurality of layers. Example 6 includes the printed circuit board of example 1, wherein a first end of the first plated slot is coupled to a first end of the second plated slot via the first ground plane and a second end of the first plated slot is coupled to a second end of the second plated slot via the second ground plane. Example 7 includes the printed circuit board of example 1, wherein the first plated slot and the second plated slot are to be formed by depth control routing. Example 8 includes the printed circuit board of example 1, wherein the first plated slot and the second plated slot are to be formed by depth control routing, wherein after depth control routing, the first plated slot and the second plated slot are to be plated to provide electrically conductive slots. Example 9 includes the printed circuit board of example 1, wherein the first plated slot and the second plated slot are one of: a thru plated slot, a one-sided plated slot, and a two-sided plated slot. Example 10 includes the printed circuit board of example 9, wherein the one-sided plated slot is to allow placement of one or more components or one or more routing traces on an opposite side of the printed circuit board. Example 11 includes the printed circuit board of example 9, wherein the two-sided plated slot is to allow placement of one or more routing traces in one or more inner layers of the printed circuit board. Example 12 includes the printed circuit board of example 1, wherein the first transmission line is to couple a switch to an optical transceiver.

Example 13 includes a system comprising: a motherboard having a switch and a transceiver connector; a plurality of transmission lines to couple the switch to the transceiver connector, wherein a first transmission from the plurality of transmission lines includes a first signal trace and a first ground plane; and a first plated slot coupled to a second plated slot via the first ground plane, wherein a ground shield is to be formed by the first plated slot, the second plated slot, the first ground plane, and a second ground plane, wherein the ground shield is to surround the first signal trace to reduce crosstalk between signal traces, wherein adjacent signal traces are to be offset in depth within the motherboard. Example 14 includes the system of example 13, wherein a plurality of signal traces is to be arranged in a crisscross pattern amongst alternatively skipped layers of the motherboard to reduce crosstalk between the plurality of signal traces. Example 15 includes the system of example 13, wherein a width of the first signal trace is to be increased to reduce signal loss. Example 16 includes the system of example 13, wherein the motherboard comprises a plurality of trace layers. Example 17 includes the system of example 13, wherein the motherboard comprises a plurality of trace layers, wherein the plurality of transmission lines is to be formed on a subset of the plurality of layers. Example 18 includes the system of example 13, wherein a first end of the first plated slot is coupled to a first end of the second plated slot via the first ground plane and a second end of the first plated slot is coupled to a second end of the second plated slot via the second ground plane. Example 19 includes the system of example 13, wherein the first plated slot and the second plated slot are to be formed by depth control routing. Example 20 includes the system of example 13, wherein the first plated slot and the second plated slot are to be formed by depth control routing, wherein after depth control routing, the first plated slot and the second plated slot are to be plated to provide electrically conductive slots.

Example 21 includes an apparatus comprising means to perform a method as set forth in any preceding example. Example 22 includes machine-readable storage including machine-readable instructions, when executed, to implement a method or realize an apparatus as set forth in any preceding example.

In various embodiments, the operations discussed herein, e.g., with reference to FIG. 1 et seq., may be implemented as hardware (e.g., logic circuitry or more generally circuitry or circuit), software, firmware, or combinations thereof, which may be provided as a computer program product, e.g., including a tangible (e.g., non-transitory) machine-readable or computer-readable medium having stored thereon instructions (or software procedures) used to program a computer to perform a process discussed herein. The machine-readable medium may include a storage device such as those discussed with respect to FIG. 1 et seq.

Additionally, such computer-readable media may be downloaded as a computer program product, wherein the program may be transferred from a remote computer (e.g., a server) to a requesting computer (e.g., a client) by way of data signals provided in a carrier wave or other propagation medium via a communication link (e.g., a bus, a modem, or a network connection).

Reference in the specification to "one embodiment" or "an embodiment" means that a particular feature, structure, and/or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments have been described in language specific to structural features and/or methodological acts, it is to be understood that claimed subject matter may not be limited to the specific features or acts described. Rather, the specific features and acts are disclosed as sample forms of implementing the claimed subject matter.

The invention claimed is:
1. A printed circuit board comprising:
a plurality of transmission lines, wherein a first transmission line from the plurality of transmission lines includes a first signal trace with an associated longitudinal length and a first ground plane; and
a first plated slot coupled to a second plated slot via the first ground plane,
wherein a ground shield is to be formed by the first plated slot, the second plated slot, the first ground plane, and a second ground plane, wherein the ground shield is to surround the first signal trace to reduce crosstalk between signal traces, and wherein the first and second plated slots each include a continuous portion extending along the longitudinal length.
2. The printed circuit board of claim 1, wherein a plurality of signal traces are to be arranged in a crisscross pattern amongst alternatively skipped layers of the printed circuit board to reduce crosstalk between the plurality of signal traces.

3. The printed circuit board of claim 1, wherein a width of the first signal trace is to be increased to reduce signal loss.

4. The printed circuit board of claim 1, wherein the printed circuit board comprises a plurality of trace layers.

5. The printed circuit board of claim 1, wherein the printed circuit board comprises a plurality of trace layers, wherein the plurality of transmission lines is to be formed on a subset of the plurality of layers.

6. The printed circuit board of claim 1, wherein a first end of the first plated slot is coupled to a first end of the second plated slot via the first ground plane and a second end of the first plated slot is coupled to a second end of the second plated slot via the second ground plane.

7. The printed circuit board of claim 1, wherein the first plated slot and the second plated slot are to be formed by depth control routing.

8. The printed circuit board of claim 1, wherein the first plated slot and the second plated slot are to be formed by depth control routing, wherein after depth control routing, the first plated slot and the second plated slot are to be plated to provide electrically conductive slots.

9. The printed circuit board of claim 1, wherein the first plated slot and the second plated slot are one of: a thru plated slot, a one-sided plated slot, and a two-sided plated slot.

10. The printed circuit board of claim 9, wherein the one-sided plated slot is to allow placement of one or more components or one or more routing traces on an opposite side of the printed circuit board.

11. The printed circuit board of claim 9, wherein the two-sided plated slot is to allow placement of one or more routing traces in one or more inner layers of the printed circuit board.

12. The printed circuit board of claim 1, wherein the first transmission line is to couple a switch to an optical transceiver.

10

13. A system comprising:
a motherboard having a switch and a transceiver connector;
a plurality of transmission lines to couple the switch to the transceiver connector, wherein a first transmission from the plurality of transmission lines includes a first signal trace and a first ground plane; and
a first plated slot coupled to a second plated slot via the first ground plane,
wherein a ground shield is to be formed by the first plated slot, the second plated slot, the first ground plane, and a second ground plane, wherein the ground shield is to surround the first signal trace to reduce crosstalk between signal traces, wherein adjacent signal traces are to be offset in depth within the motherboard.

14. The system of claim 13, wherein a plurality of signal traces is to be arranged in a crisscross pattern amongst alternatively skipped layers of the motherboard to reduce crosstalk between the plurality of signal traces.

15. The system of claim 13, wherein a width of the first signal trace is to be increased to reduce signal loss.

16. The system of claim 13, wherein the motherboard comprises a plurality of trace layers.

17. The system of claim 13, wherein the motherboard comprises a plurality of trace layers, wherein the plurality of transmission lines is to be formed on a subset of the plurality of layers.

18. The system of claim 13, wherein a first end of the first plated slot is coupled to a first end of the second plated slot via the first ground plane and a second end of the first plated slot is coupled to a second end of the second plated slot via the second ground plane.

19. The system of claim 13, wherein the first plated slot and the second plated slot are to be formed by depth control routing.

20. The system of claim 13, wherein the first plated slot and the second plated slot are to be formed by depth control routing, wherein after depth control routing, the first plated slot and the second plated slot are to be plated to provide electrically conductive slots.

* * * * *